US009157960B2

(12) United States Patent
Bringivijayaraghavan et al.

(10) Patent No.: US 9,157,960 B2
(45) Date of Patent: Oct. 13, 2015

(54) THROUGH-SUBSTRATE VIA (TSV) TESTING

(75) Inventors: Venkatraghavan Bringivijayaraghavan, Plano, TX (US); Jason M. Brown, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 564 days.

(21) Appl. No.: 13/411,167

(22) Filed: Mar. 2, 2012

(65) Prior Publication Data

US 2013/0230932 A1 Sep. 5, 2013

(51) Int. Cl.
*G01R 31/3185* (2006.01)
*H01L 21/66* (2006.01)
*G01R 31/317* (2006.01)

(52) U.S. Cl.
CPC ........ *G01R 31/318513* (2013.01); *H01L 22/22* (2013.01); *G01R 31/31717* (2013.01); *H01L 2924/0002* (2013.01)

(58) Field of Classification Search
CPC ..... G01R 31/26; G01R 31/3177; G01R 1/067
USPC ........ 324/762.01–762.09; 257/48; 438/14–18
See application file for complete search history.

(56) References Cited

U.S. PATENT DOCUMENTS 8,436,639 B2 * 5/2013 Goel .............................. 326/16
2008/0154532 A1 * 6/2008 Huillet .......................... 702/122
2010/0060310 A1 * 3/2010 Laisne et al. .................... 326/10
2011/0080184 A1 4/2011 Wu et al.
2011/0084722 A1 * 4/2011 Nishioka .................. 324/762.01
2011/0102006 A1 * 5/2011 Choi et al. ................ 324/750.3
2011/0102011 A1 5/2011 Van der Plas et al.
2011/0309359 A1 * 12/2011 Saen et al. ...................... 257/48
2012/0104388 A1 * 5/2012 Choi et al. ...................... 257/48
2013/0069062 A1 * 3/2013 Bhoovaraghan et al. ....... 257/48

FOREIGN PATENT DOCUMENTS

WO WO 9507409 A1 * 3/1995 ............. F02D 41/20
WO WO-2011101393 A1 8/2011
WO WO-2011117418 A1 9/2011

OTHER PUBLICATIONS

Yeh, Tung-Hua, et al., "Interconnect test for core-based designs with known circuit characteristics and test patterns", 2011 IEEE International Conference on IC Design & Technology (ICICDT), (2011), 1-4.

* cited by examiner

*Primary Examiner* — Melissa Koval
*Assistant Examiner* — Courtney McDonnough
(74) *Attorney, Agent, or Firm* — Schwegman Lundberg & Woessner, P.A.

(57) ABSTRACT

Various embodiments comprise apparatuses and methods for testing and repairing through-substrate vias in a stack of interconnected dice. In various embodiments, an apparatus is provided that includes a number of through-substrate vias to couple to one or more devices, at least one redundant through-substrate via to allow a repair of the apparatus, and a pair of pull-up devices coupled to the through-substrate vias and the redundant through-substrate via to provide a high-data value to the first end of the respective through-substrate vias. A test register is coupled the second end of each of the through-substrate vias and the redundant through-substrate via to store a received version of the high-data value. A comparator compares the high-data value with the received version of the high-data value to test the through-substrate vias for short-circuit connections.

18 Claims, 9 Drawing Sheets

THROUGH-SUBSTRATE VIA (TSV) TESTING

BACKGROUND

Computers and other electronic systems, for example, digital televisions, digital cameras, and cellular phones, often have one or more memory devices to store information. Increasingly, memory or other devices are being reduced in size or have devices stacked to achieve a higher density of storage capacity within a similar footprint. However, stacked devices must still be robust in die-to-die communications.

DETAILED DESCRIPTION

In order to increase integrated circuit device density within a given area (e.g., a footprint on an electrical device or board), integrated circuit dice are often stacked on top of one another. One such example may be memory cards where a number of dice are stacked to increase an overall amount of memory. Each die has a number of integrated circuit devices fabricated on a substrate. However, each die within the stack frequently needs to communicate with other dice in the stack (e.g., slave dice typically need to communicate with a master die to perform their functions). Such stacks may be interconnected from one side of the substrate to the other. The interconnections include through-substrate vias (TSVs). When the substrate comprises silicon, the interconnections may also be referred to as through-silicon vias. If the TSVs are defective (e.g., are open or shorted), electrical communications may not occur throughout the stack as intended.

Figure 1:
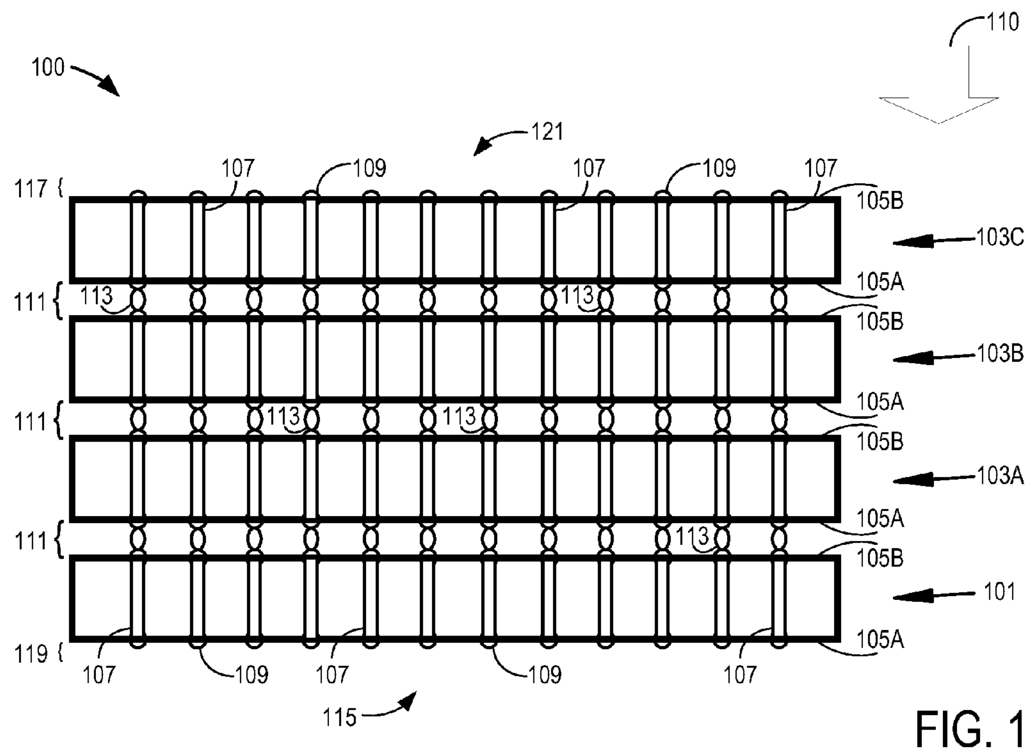
FIG. 1 shows a cross-sectional view of a microelectronics package having a number of stacked and interconnected integrated circuit dice.

Referring now to FIG. 1, a cross-sectional view of a microelectronics package 100 having a number of stacked and interconnected integrated circuit dice is shown. The stacked and interconnected dice may form at least a portion of a microelectronics package. The microelectronics package 100 is shown to include four integrated circuit dice. In this example, the four integrated circuit dice include a master die

101, and three slave dice 103A, 103B, 103C, however, any number of integrated circuit die may be incorporated. The three slave dice 103A, 103B, 103C may be identified individually as the first, the second, and the third slave die, respectively. The identification as first, second, and third does not necessarily indicate any type of order or importance and is simply provided for ease in identification throughout the various embodiments.

In other embodiments, the microelectronics package 100 may contain any other desired number of integrated circuit dice. Each of the integrated circuit dice has a first surface 105A and a second surface 105B. An arrow 110 indicates a normal orientation of the dice in which the first surface 105A is located at an upper surface of the substrate where the upper surface is generally used during fabrication of integrated circuit devices on the substrate. That is, the upper surface of the substrate is the surface used to form integrated circuit devices on a die.

A number of through-substrate vias (TSVs) 107 is shown on each of the four dice, including the master die 101, and the slave dice 103A, 103B, 103C. The TSVs 107 may also be referred to as through-silicon vias, depending upon the substrate type (e.g., silicon or other elemental semiconductors, compound semiconductors, or other substrate types known in the art) from which the dice are formed. The TSVs 107 may be formed from the first surface 105A through the integrated circuit die to the second surface 105B (or alternatively, from the second surface 105B to the first surface 105A). In operation, the TSVs 107 can be selectively connected to certain metallization layers within the die and therefore allow an interconnection from, for example, integrated circuit devices formed on the first surface 105A and through to the second surface 105B of the master die 101, to connect to one or more of the slave dice 103A, 103B, 103C, in the stack.

Each of the TSVs 107 has a conductive bonding pad 109 formed on either end of the TSVs 107. Adjacent ones of the dice are electrically coupled by a conductive electrical connector 113 that is placed or formed between the conductive bonding pads. The conductive electrical connector 113 may be, for example, a wirebond, a solder ball, conductive tape, a C4 interconnect (Controlled Collapse Chip Connection), or other suitable electrical connector. The conductive electrical connectors 113 therefore form electrical interconnects 111 between each of the adjacent dice. The conductive bonding pads 109 on the first surface 105A of the master die 101 may be accessible to form an external interface 115. The external interface 115 allows interconnection with other devices such as, for example, a microprocessor. The external interface may be connected to pins (not shown) of the microelectronic package by bonding wires allowing accessibility from outside the package. Similarly, the conductive bonding pads 109 on the second surface 105B of the third slave die 103C form an external slave interface 121 that may be used, for example, to interface with other devices or, alternatively, allow interconnection with other slave dice in a larger stack.

Figure 2:
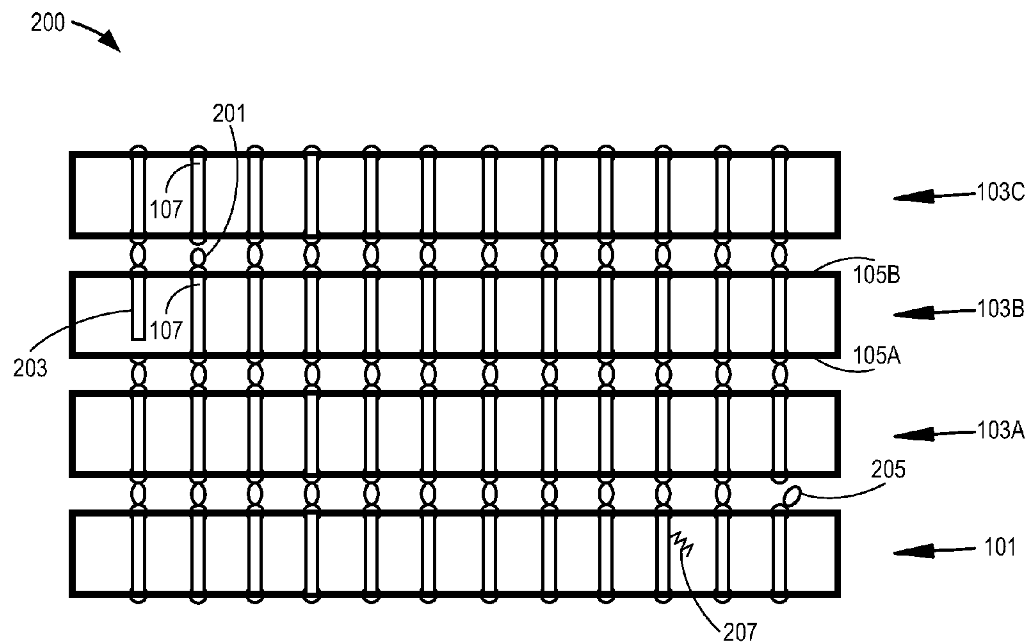
FIG. 2 shows a cross-sectional view of a microelectronics package having a number of stacked and interconnected integrated circuit dice with interconnect defects.

In FIG. 2, a cross-sectional view showing a microelectronics package 200 having a number of stacked and interconnected integrated circuit dice with interconnect defects indicates various examples of the types of defects that may occur when such stacks are formed. Any one of these various defect types may cause electrical communication issues between the master die 101 and one or more of the slave dice 103A, 103B, 103C. For example, a malformed conductive electrical connector 201 has failed to complete an electrical pathway between adjacent ones of the TSVs 107. The malformed conductive electrical connector 201 may result from an incomplete wirebond or an undersized solder ball. In another defect type, an open TSV 203 has been incompletely formed between the first surface 105A and the second surface 105B of the second slave die 103B, thus presenting a missing connection (e.g., an open circuit) between the first slave die 103A and the second slave die 103B. A misaligned conductive electrical conductor 205 also prevents an improper electrical interconnect between the master die 101 and the first slave die 103A. The misaligned conductive electrical conductor 205 may be, for example, a C4 interconnect that failed to collapse properly. In still another defect type, a shorted TSV 207 provides an electrical connection between the TSV and the substrate of the master die 101. The shorted TSV 207 may cause drive and leakage issues depending upon a resistance value of the short and the short-tolerance or design of the connected electrical device.

Figure 3:
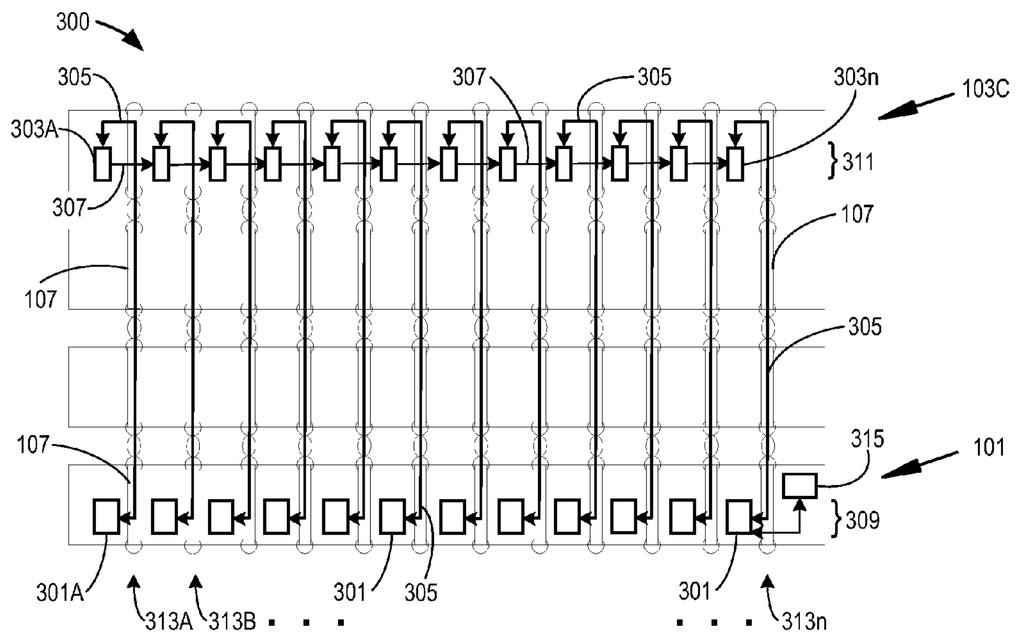
FIG. 3 shows an illustrative embodiment for TSV testing using a scan chain arrangement.

Referring now to FIG. 3, an illustrative embodiment for TSV testing using a scan-chain arrangement 300 is shown. The scan-chain arrangement may be used to test each of the TSVs in the microelectronics package 100, 200 of FIG. 1 and FIG. 2. The scan-chain arrangement 300 is shown to include test pattern transmission and receive circuitry, including transmission circuitry 309 in the master die 101 and receive circuitry 311 in each of the slave dice 103A, 103B, 103C. Note that the receive circuitry 311 is only shown in the third slave die 103C to avoid obscuring detail in the figure. However, a person of ordinary skill in the art will understand that the same or similar types of circuitry may be replicated in the first slave die 103A and the second slave die 103B of FIG. 1 as well.

The transmission circuitry 309 is electrically coupled to the receive circuitry 311 through a number of electrical communication paths 305 established through the TSVs. A person of skill in the art, upon reading the disclosure provided herein, will further understand that the transmission circuitry 309 may also receive data, and similarly, the receive circuitry 311 may also transmit data. Therefore, the terms transmit and receive are provided simply as identifiers for brevity of notation and are not intended to indicate a sole function of the respective devices. Thus, in some embodiments, the transmission circuitry 309 and/or the receive circuitry 311 may operate as a transceiver.

Overall, the transmission circuitry 309 sends test data to the receive circuitry 311 through the electrical communication paths 305. The receive circuitry 311 receives the test data and then stores and transmits the test data back to the transmission circuitry 309. A comparison is then made through a comparator 315 between the test data sent and the test data later received. If there are any differences between the test data sent and the test data later received, one or more defective TSVs can be identified.

The comparator 315 may be implemented as, for example, an operational amplifier-based voltage comparator or a software-based comparator, such as a null-level detector. Although the comparator 315 is shown as being located within the master die 101, the comparator 315 may be located in any device interconnected with the master die 101. Further, the comparator 315 may form a portion of another device in electrical communication with the master die 101, such as a coupled controller or microprocessor.

Each connective string 313A, 313B, . . . , 313*n*, of the serially-connected ones of the TSVs 107 has a respective transceiver 301A, . . . , 301*n* (e.g., master transceivers) located within the master die 101 and a respective transceiver 303A, . . . , 303*n* (e.g., slave transceivers) located in the third slave die 103C. A person of ordinary skill in the art will recognize that, depending upon a particular operation or location during testing, the transceivers may function as either a transmitter or a receiver. The transceivers 301A, . . . , 301*n* and the transceivers 303A, . . . , 303*n* may comprise a number of components known independently in the art including, for example, operational amplifiers, buffers, and follower circuitry. Further, the transceivers 301A, . . . , 301*n* and the transceivers 303A, . . . , 303*n* may be fabricated or otherwise formed on the various dice during formation of other integrated circuit devices on the respective dice.

The (serial) connections to the TSVs 107 may be tested as follows. Each of the transceivers 301A, . . . , 301*n* in the master die 101 writes a predetermined test pattern to the transceivers 303A, . . . , 303*n* in the third slave die 103C through each of the connective strings 313A, 313B, . . . , 313*n*. Each of the respective transceivers 303A, . . . , 303*n* receives the predetermined test pattern and stores the test data in a test register associated with the respective ones of the transceivers 303A, . . . , 303*n*.

The test registers and the transceivers 303A, . . . , 303*n* are electrically coupled with one another to form a scan chain 307. The test data from each of the test registers and transceivers 303A, . . . , 303*n* are forwarded to the last test register and its respective transceiver 303*n*. In one embodiment, the stored test data from each of the test registers may be scanned using only the last transceiver 303*n* in the third slave die 103C, back to the master die 101 through the last connective string 313*n*. Since the data from the test pattern are only transmitted back through the last connective string 313*n*, the last connective string 313*n* may be considered to be a more useful communication string. However, any one of the connective strings may be used to transmit data. Thus, each of the TSVs 107 within the last connective string 313*n* should be in electrical communication with one another so that proper and thorough testing can occur. Consequently, the transmission and receive circuitry associated with at least the last connective string 313*n*, being the more useful communication string, may be modified to ensure functionality of the associated TSVs.

Once the transceivers 301A, . . . , 301*n* in the master die 101 receive the data from each of the transceivers 303A, . . . , 303*n*, the data are each compared with the originally transmitted test pattern for verification of transmission/receipt accuracy. If a determination is made that the received test data match the transmitted test pattern, then each of the connections between the TSVs 107 should be intact (e.g., as shown in FIG. 1). If a determination is made that the received test data does not match the transmitted test pattern, then a repair is likely needed to one or more of the TSVs 107 in one or more of the connective strings 313A, 313B, . . . , 313*n*. The repair is performed by substituting a subsequent TSV for the TSV found to be defective. Details of various types of TSV testing and repairs are discussed below. Once repairs are made, the entire test process may be run again until either the test passes or no further repairs can be made.

Figure 4:
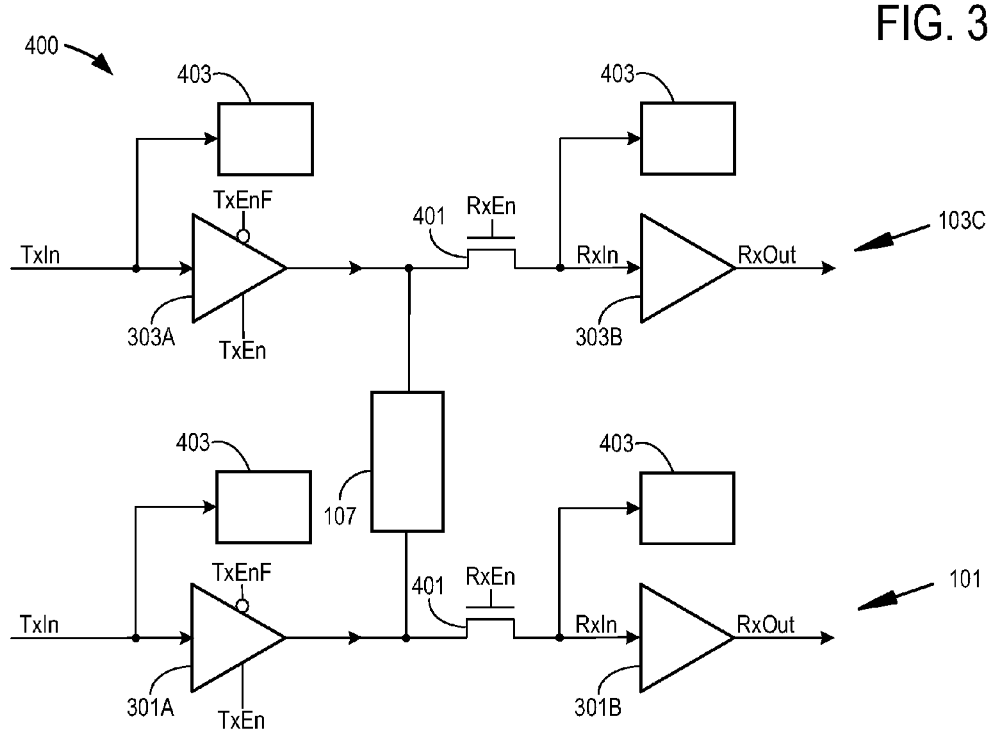
FIG. 4 shows an embodiment of a portion of a transmitter/receiver circuit used for TSV testing in the scan chain of FIG. 3.

With reference now to FIG. 4, an illustrative embodiment of a portion of a transmitter/receiver circuit 400 used for TSV testing in the scan chain of FIG. 3 is shown. As with FIG. 3, the portion of the transmitter/receiver circuit 400 shows only circuitry associated with the master die 101 and the third slave die 103C. In some embodiments, the first slave die 103A and the second slave die 103B each may have circuitry similar to or identical to that of the third slave die 103C. However, only the master die 101 and the third slave die 103C are shown so as not to obscure the figure.

The TSV 107 is coupled on opposing ends to the transceivers 301A, 303A, the transceivers 301B, 303B, and to a pair of pass transistors 401. As discussed above with reference to FIG. 3, a test register 403 is associated with each of the transceivers. However, the portion of the transmitter/receiver circuit 400 may have a high failure probability if there are any defects with the TSV 107 as discussed above with regard to FIG. 2. For example, if the TSV 107 is open, then the test pattern data transmitted from the transceiver 301A cannot be received by the transceiver 303B in the third slave die 103C. Further, if the TSV 107 is shorted to the substrate, for example, as indicated by the shorted TSV 207 of FIG. 2, then the transceiver 301A may not be able to source sufficient power for the test pattern data to be transmitted.

Figure 5:
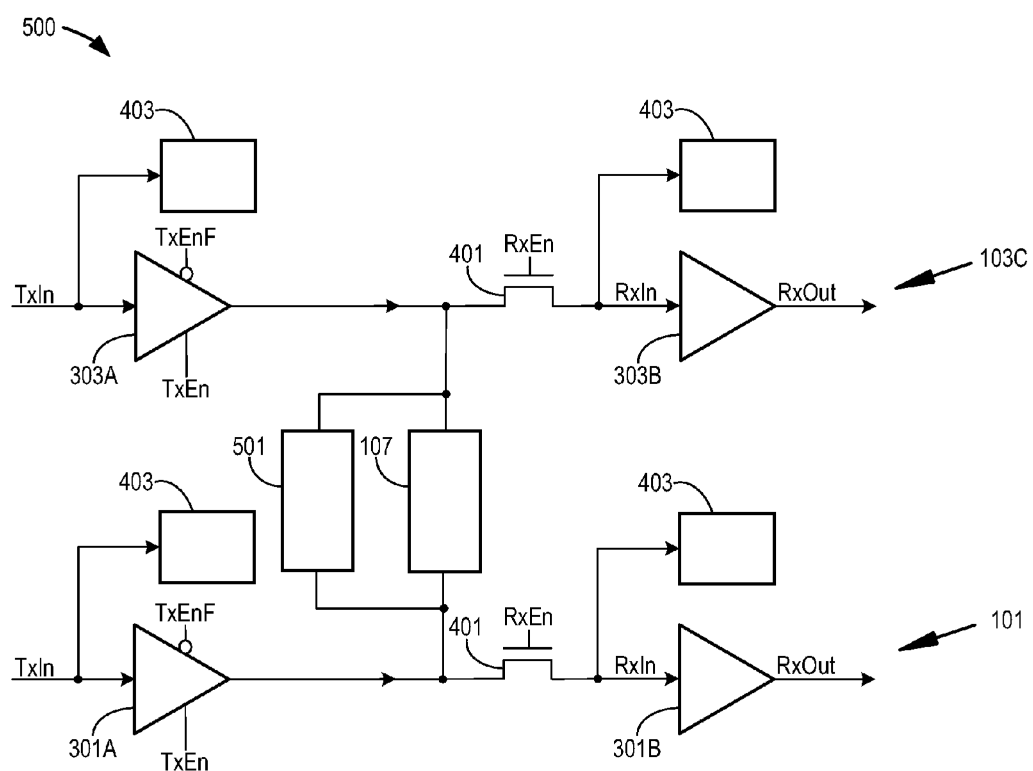
FIG. 5 shows another embodiment of a portion of a transmitter/receiver circuit used for TSV testing in the scan chain of FIG. 3 and incorporating a redundant TSV.

FIG. 5 shows another embodiment of a portion of a transmitter/receiver circuit used for TSV testing in the scan chain of FIG. 3 and incorporating a redundant TSV 501. The redundant TSV 501, in parallel with the TSV 107, reduces the probability of TSV failure due to an open connection. Should the TSV 107 fail due to, for example, a malformed conductive electrical connector 201, a misaligned conductive electrical conductor 205, or an open TSV 203, as shown in FIG. 2, then the redundant TSV 501 provides a communication pathway from the master die 101 to the third slave die 103C.

However, the redundant TSV 501 may not eliminate a TSV failure due to a short between either the TSV 107 or the redundant TSV 501 to the substrate. If either of the shorts has enough resistance, such that the transceiver 301A can handle the short (e.g., by sourcing sufficient power to the TSV), then testing for shorts in the TSVs may not be necessary. Of course, testing for open TSVs may still be needed depending upon the design of interconnect circuitry and a location of where any open TSVs are located. Determining whether the transceiver 301A can handle the short will depend upon, for example, various design parameters associated with integrated circuit devices formed on the various dice. Such techniques for designing integrated circuit devices are known independently in the art. If, however, shorts cannot be tolerated on the TSVs, then another circuit may be considered.

Figure 6:
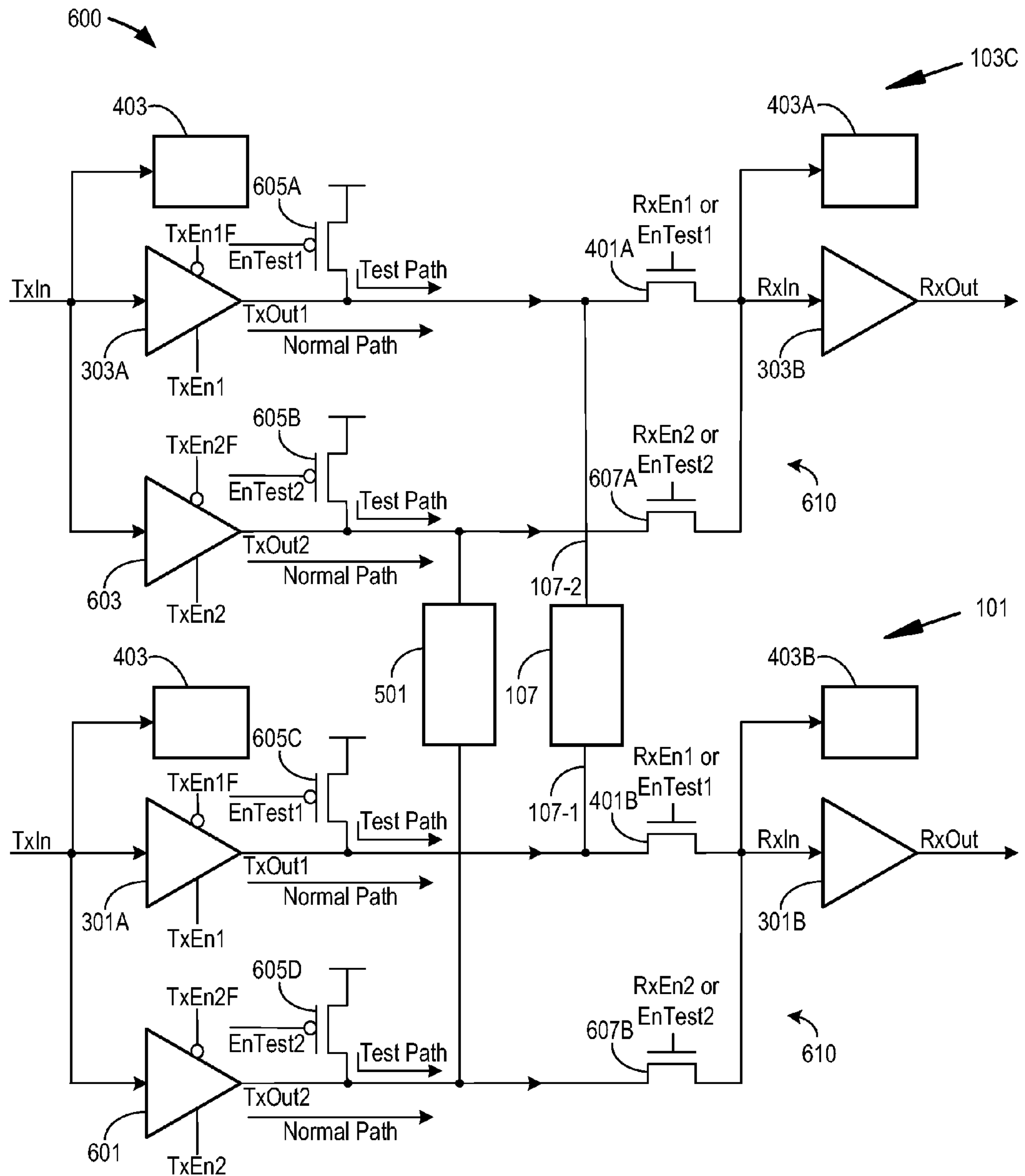
FIG. 6 shows an embodiment of a circuit used for TSV testing including circuitry for testing TSV faults, including shorts and opens.

Referring now to FIG. 6, an embodiment of the circuit used for TSV testing including a portion of circuitry 600 for testing TSV faults, including shorts and opens, is shown. The portion of the circuitry 600 is similar to that shown in FIG. 5. However, the redundant TSV 501 is not coupled in parallel with the TSV 107. Rather, the transceiver 301A and the transceiver 303A each have a redundant transceiver 601 and a redundant transceiver 603 that are coupled in parallel. The redundant transceiver 601 and the redundant transceiver 603 are also electrically coupled to the redundant TSV 501. Further, on the output of each of the transceivers, a weak pull-up device 605A, 605B is included that may be enabled during either open or short testing. Each of the redundant transceiver 601 and the redundant transceiver 603 further includes a pass gate 607A, 607B, respectively, coupled in series between the respective redundant pass gate and the associated subsequent one of the transceiver 301B and the transceiver 303B, each of which is coupled to a respective test register 403A, 403B.

During operation of the scan-chain arrangement 300 of FIG. 3, if the test pattern data received back from the third slave die by the master die 101 is different from the transmitted test pattern data, the TSV 107 may be tested for either an open connection or a shorted connection. As noted above, the portion of the transmitter/receiver circuit 500 of FIG. 5 may be used to test for open connection in the TSV 107. However, the portion of the circuitry 600 can test for either an open connection or a shorted connection.

Both open and short testing of the TSVs can be self enabled (e.g., using a built-in self test (BIST)) upon power up of the devices, for each die in the stack. The TSV testing may begin from either the master die 101 with results stored in the test register 403A on the third slave die 103C side, or, alternatively, the testing may begin from the third slave die 103C with results being stored in the test register 403B on the master die 101.

For example, in one embodiment of short testing, the transceiver 301A and the redundant transceiver 601 are disabled and one of the associated weak pull-up devices 605C, 605D is enabled. The transceiver 303A, the redundant transceiver 603, and their associated weak pull-up devices 605C, 605D, are also disabled. The data are passed through either the TSV 107 or the redundant TSV 501, through to the third slave die 103C, with the data then being stored in the test register 403A. A comparison is made of the data stored in the test register 403A with original transmitted data.

In another embodiment of short testing, the transceiver 303A and the redundant transceiver 603 are disabled and the associated one of the weak pull-up devices 605A, 605B, is enabled. The transceiver 301A, the redundant transceiver 601, and their associated weak pull-up devices 605C, 605D, are disabled. In this case, the data are again passed through either the TSV 107 or the redundant TSV 501 and stored in the test register 403B. A comparison is made of the data stored in the test register 403B with original transmitted data.

The short testing may then conducted for each of the connective strings 313A, 313B, . . . , 313*n* (e.g., the serial TSV paths). Alternatively, the short testing may only be conducted for the last connective string 313*n*, identified earlier as a potential critical connective string.

In a more detailed illustrative embodiment of a test situation where the transceiver 301A and the transceiver 303A are enabled, the associated weak pull-up devices 605C, 605A are disabled. An open connection in the TSV 107 prevents the test program data transmitted from the master die 101 from reaching the third slave die 103C, as discussed above. However, should the TSV 107 fail due to a suspected short, short testing may be performed as follows.

The transceiver 301A is disabled. The weak pull-up device 605C and the pass transistor 401A of the third slave die 103C are enabled to provide a test path from the master die 101 through the TSV 107 and to the test register 403A of the third slave die 103C. As indicated in FIG. 6, the test path places the master die 101 end of the TSV 107 at a high-data value (e.g., at $V_{DD}$). If the TSV 107 is not shorted, a resultant high-data value is recorded in the test register 403A. However, if the TSV 107 is shorted, a value less than the high-data value is recorded in the test register 403A.

As discussed above, the test value stored in the test register 403A may be compared with the high-data value and a determination made whether the values are the same. If the value recorded in the test register 403A is less than a predetermined percentage of the high-data value, the TSV 107 is presumed to be shorted. If the TSV is shorted, a determination of whether the TSV 107 needs to be replaced with a redundant TSV depends upon whether the value of the resistance can be tolerated within the circuit. The toleration of resistance is discussed in more detail below.

If the TSV 107 is determined to be defective, due to either an open-circuit or a short-circuit condition, the redundant TSV 501 may be substituted for the TSV 107. The transceiver 301A and the transceiver 303A are then disabled and the redundant TSV 501 is tested in a manner similar to that discussed above with reference to the TSV 107 testing.

For short testing, the redundant transceiver 601 is disabled. The weak pull-up device 605D and the pass gate 607A of the third slave die 103C are enabled to provide a test path from the master die 101 through the redundant TSV 501 and to the test register 403A of the third slave die 103C. As indicated in FIG. 6, the test path places the master die 101 end of the redundant TSV 501 high (e.g., at $V_{DD}$). If the redundant TSV 501 is not shorted, a resultant high-data value is recorded in the test register 403A. However, if the redundant TSV 501 is shorted, a value less than the high-data value is recorded in the test register 403A. As discussed above, the test value stored in the test register 403A may be compared with the high-data value and a determination made whether the values are the same. If the value recorded in the test register 403A is less a predetermined percentage than the high-data value, the redundant TSV 501 is presumed to be shorted.

The design of the weak pull-up devices may depend upon a size of the stack (e.g., the total number of one or more master devices and the slave dice), and the lowest value of short resistance that is considered acceptable for proper functionality of the various integrated circuit devices, perhaps based on a predicted number of bit read or write errors to be expected over time. Another factor to be considered is the cumulative effect of each of the pull-up devices coupled to a given connective string of TSVs. For example, if a weak pull-up device in each of the slave dice 103A, 103B, 103C, is enabled simultaneously (e.g., when the testing of different dice coincides), the sourced power from the combination of the three pull-up devices may be significantly greater than if a single pull-up device is enabled separately. That is, the weak pull-up device in one die may get assistance from one or more other pull-up devices located on other dice in the stack. Thus, the size of the weak pull-up device may need to be considered. Calculations and determinations for the strength of a pull-up device are known independently in the art.

In other embodiments, the weak pull-up device may be designed to increase power as needed during short testing of the TSVs. For example, the pull-up device may start at a normal power setting. Depending upon the result stored in the test register, the weak pull-up device may be programmed or otherwise configured (e.g., during manufacture) to increase power on subsequent testing should initial results prove inconclusive. The power setting may be increased in terms of integral powers (e.g., 2 times, 4 times, 8 times, etc.) or in accordance with some other scheme.

Figure 7:
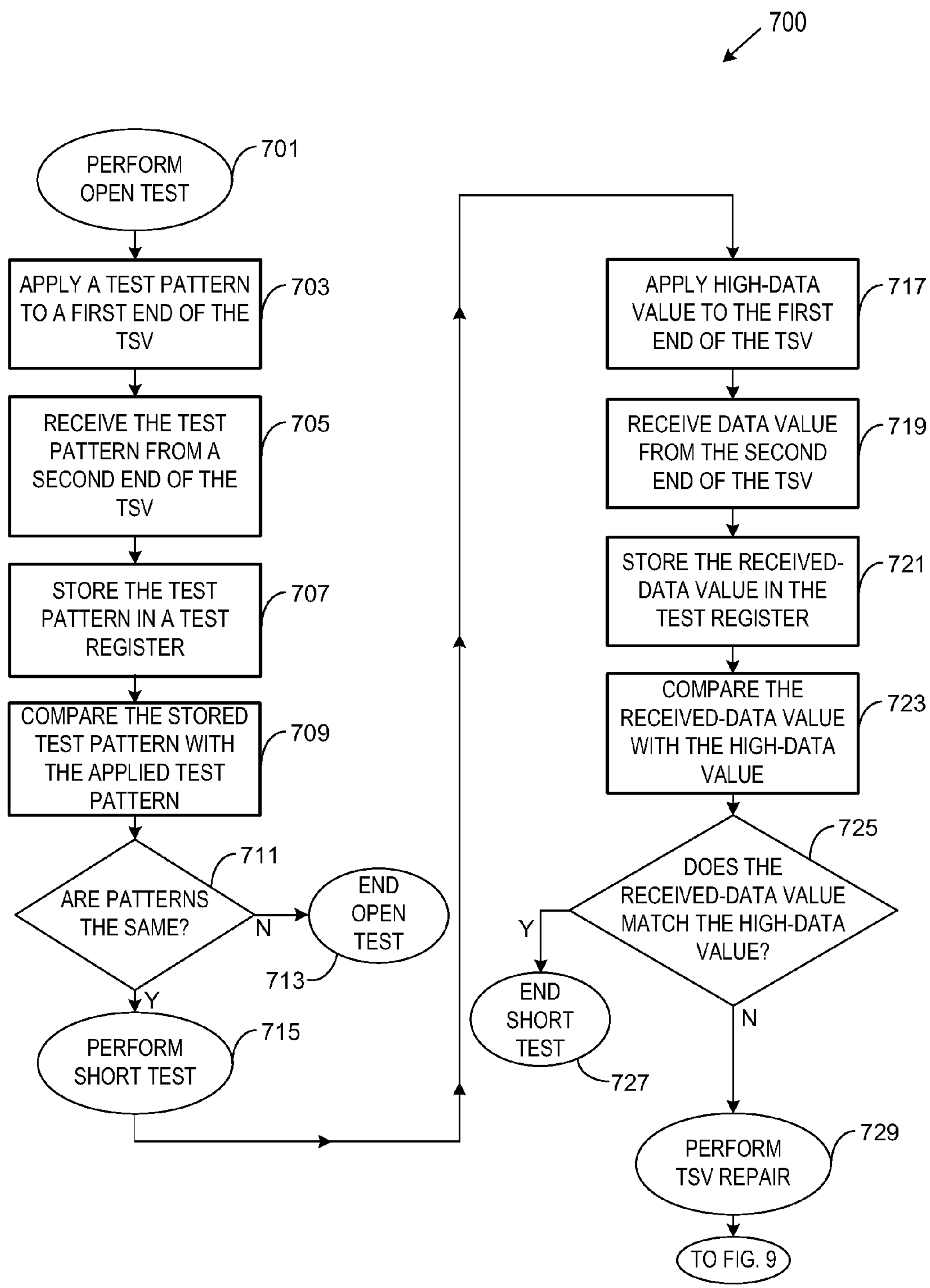
FIG. 7 shows a method for performing open and short testing on TSVs.

FIG. 7 shows a method 700 for performing open and short testing on TSVs. With continuing reference to FIG. 6, at operation 701, a decision to perform an open test is made. This may take the form of an externally-initiated test, or as part of a built-in self test, for example. At operation 703, a test pattern is applied to the first end 107-1 of the TSV 107. The test pattern is received from the second end 107-2 of the TSV 107 at operation 705 and stored in the test register 403A at operation 707. The stored test pattern is then compared with the applied test pattern at operation 709. The comparison may be made with, for example, the comparator 315 of FIG. 3.

A determination is made whether the stored and applied test patterns are the same at operation 711. If the test patterns are not the same, the TSV 107 is presumably open or otherwise defective and the open test is ended at operation 713. Other TSVs may be tested by performing the method 700 again, beginning at operation 701. If the test patterns are the same, a determination is made that the TSV 107 is not open and the method 700 continues at operation 715 where the TSV 107 is tested for a short-connection to the substrate.

At operation 717, a high-data value is applied to the first end 107-1 of the TSV 107. As discussed above, the high-data value is developed by enabling the weak pull-up device 605C. The data value is then received from the second end 107-2 of the TSV 107 at operation 719 and stored in the test register 403A at operation 721. The received-data value and the high-data value at then compared at operation 723. A determination is made at operation 725 whether the received-data value matches the high-data value with a predetermined percentage, as discussed above. If so, the short test is ended at operation 727. If the two data values do not match within the predetermined percentage, TSV repair operations ensue at operation 729. TSV repair is now discussed in detail with reference to FIGS. 8A, 8B, and 9.

Figure 8A:
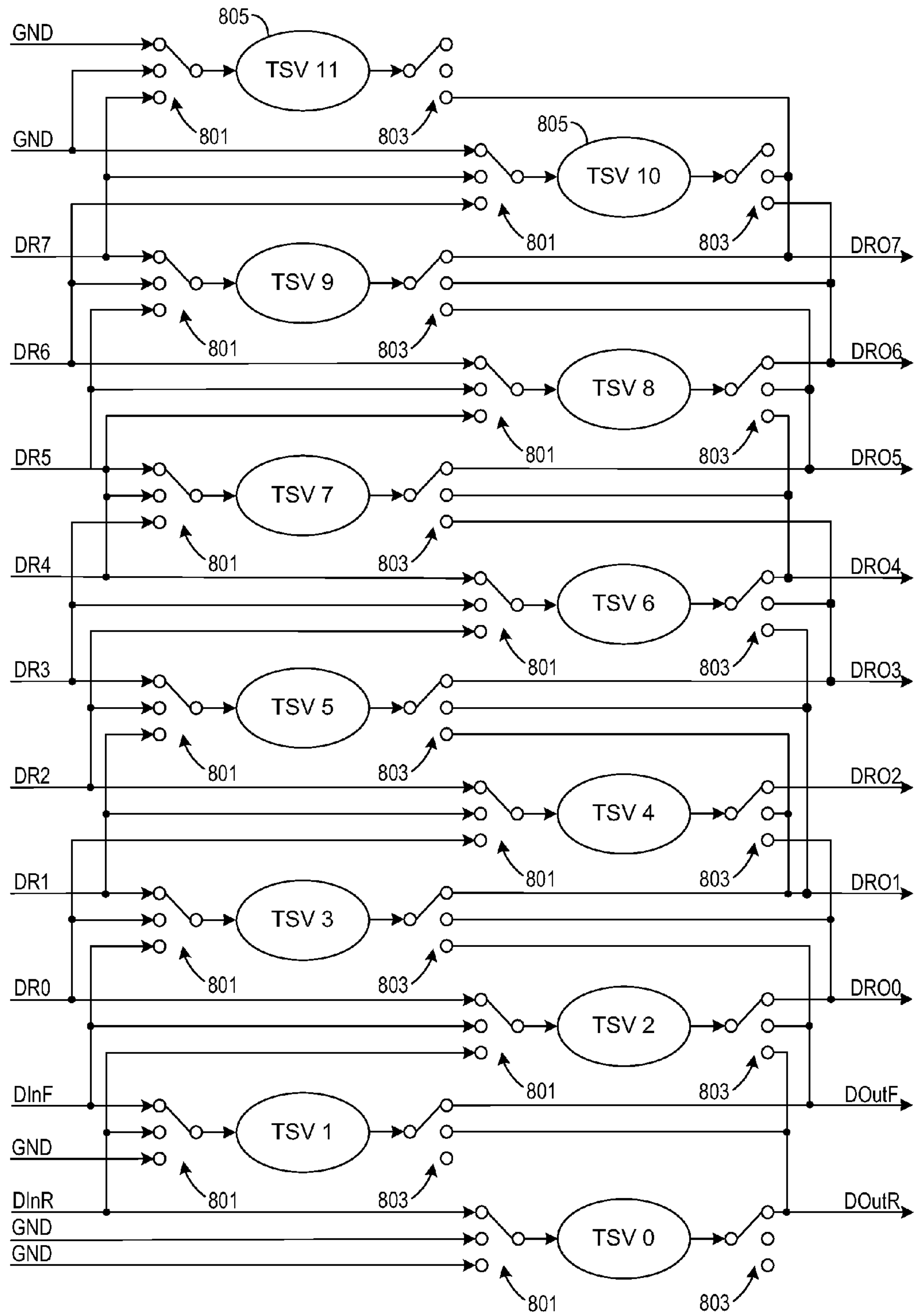
FIG. 8A shows an embodiment of a default switch connection for a number of TSVs and including redundant TSVs.

Referring now to FIG. 8A, an explanation of a repair methodology is provided. The repair methodology may be invoked should any of the TSVs 107 or the redundant TSVs 501 be open or shorted. FIG. 8A shows an embodiment of a default switch connection for a number of TSVs, including two redundant TSVs 805. In this embodiment, 12 TSVs are shown. Each of the TSVs has a three-position switched input 801 and a three-position switched output 803. The three positions may be considered to be three programmable I/Os (input/outputs). Each of the switches can be, for example, a multiplexer, a data selector, or various types of transconductance devices. In some embodiments, each of the switches may be a fused link.

In an illustrative example, the configuration of the TSVs and associated switched I/Os of FIG. 8A may be used with memory devices. With a memory device, data (DQ) lines may include eight TSVs for data read (DR) lines, two TSVs for data rising and falling clock signals (e.g., DInR and DInF, respectively), and two redundant TSVs. In this embodiment, TSV 0 and TSV 1 are provided for the DInR and DInF signals, respectively; TSV 2 through TSV 9 are provided for the DR lines (DR0 through DR7), with the two redundant TSVs 805, identified in FIG. 8A as TSV 10 and TSV 11.

In this embodiment, having two redundant TSVs 805 per group allows up to two repairs to be made per group. In some embodiments, the redundant TSVs 805 may be placed at one end of the group so that any shift used to replace a defective TSV with a redundant TSV is unidirectional, as described below with reference to FIG. 8B. The unidirectional shift simplifies the overall logic by shifting all of the switch positions needed in one direction and not requiring the repairs to wrap to the beginning of the TSV chain.

The default switch position for the two redundant TSVs 805 is a grounded input and a non-connected output. To determine whether a repair is needed, the TSVs are first tested for proper conductivity using the scan chain, discussed with reference to FIG. 3 through FIG. 6. If the scan chain test determines that a bad TSV is present, a repair may be made by rerouting the I/O signals from the bad TSV to an adjacent TSV by making appropriate changes on the switched inputs 801 and the switched outputs 803.

Figure 8B:
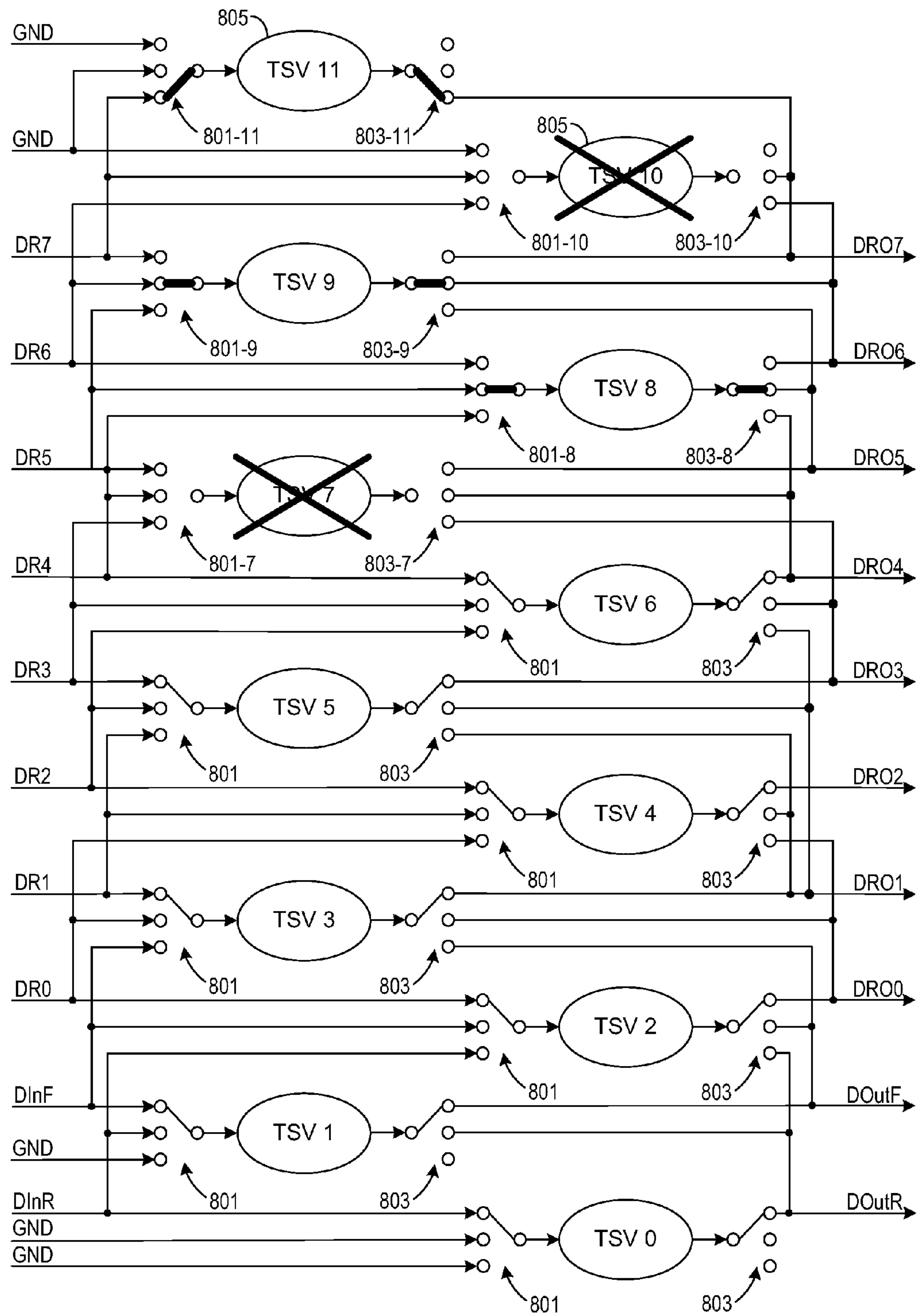
FIG. 8B shows an embodiment of the switch connection of FIG. 8A after repairing two defective TSVs.

Referring now to FIG. 8B, an example of the switch connection of FIG. 8A is shown after two defective TSVs have been repaired. In the example of FIG. 8B, TSV 7 and TSV 10 have been found to be defective. In this example, the initial test for proper conductivity using the scan chain methodology would first find TSV 7 to be defective (since TSV 10 is one of the redundant TSVs and would not initially be tested). Therefore, since TSV 7 is defective, data formerly entering TSV 7 are now shifted to TSV 8 and the I/Os of TSVs subsequent to TSV 8 are shifted as well. The connection from DR5 through the switched input 801-7 to TSV 7 has been disabled or removed. Similarly the switched output 803-7 of TSV 7 to DRO5 has also been disabled or removed. The data line, DR5, is now connected through the switched input 801-8 to TSV 8. The output of TSV 8, formally connected to DRO6, is now switched through the switched output 803-8 to DRO5. The data line DR6, formally connected to TSV 8, is rerouted to TSV 9 through input switch 801-9 and the output of TSV 9 is rerouted to DRO6 through output switch 803-9.

Once TSV 7 has been repaired, the scan chain process is again executed to check for any further defective TSVs. In this example, the second round of the scan chain methodology has determined that TSV 10, one of the redundant TSVs 805, is also defective. Ordinarily, if none of the TSVs were found to be defective, the scan chain methodology would only need to be executed once. However, in this case, since TSV 7 was found to be defective, the scan chain methodology was executed a second time and detected one the redundant TSVs 805 was also defective. Thus the subsequent switching occurring after TSV 7 required the second redundant TSV 805 (TSV11) to be used for a final repair. Thus, the data line DR7 that was shifted from TSV 9 is now shifted to TSV 11 through the switched input 801-11. The output from TSV 11 is switched to DRO7 through the switched output 803-11.

With redundant TSVs 805, up to two repairs can be made to account for two defective TSVs. As will be understandable to a person of skill in the art upon reading the disclosure provided herein, more or less than two redundant TSVs 805 may be incorporated for each group depending upon the degree of protection desired for a particular scan line coupled with the available real estate on a given integrated circuit die.

An increased number of useful pathways may benefit from an increased number of redundant TSVs. For example, if additional redundant TSVs are contemplated, the three-position switched inputs 801 and the three-position switched outputs 803 may be used with an increased number of redundant TSVs.

Figure 9:
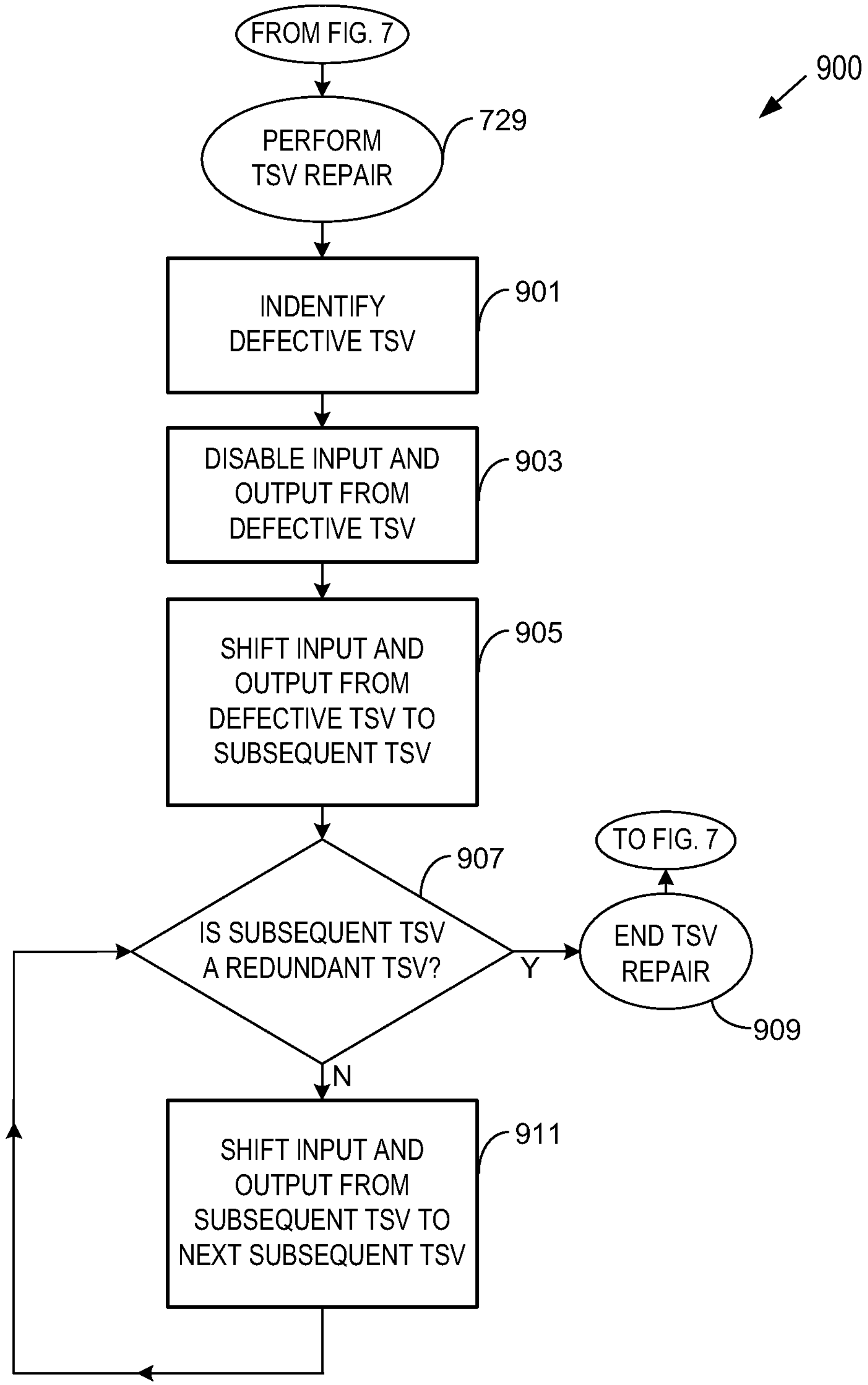
FIG. 9 illustrates an embodiment of a method for repairing TSVs.

FIG. 9 illustrates an embodiment of a method 900 for repairing through-substrate vias. An identification of the defective TSV is confirmed at operation 901. At operation 903, the associated input and the output switches are each removed or disabled from the defective TSV. The inputs and outputs previously connected to the defective TSV are shifted to a subsequent TSV in operation 905.

A determination is made at operation 907 as to whether the subsequent TSV is a redundant TSV. If the subsequent TSV is a redundant TSV, then the repair is completed the method 900 is terminated at operation 909. At this point, the newly-switched in TSV (the redundant TSV) may be open and short tested by returning to the method 700 of FIG. 7. However, if the subsequent TSV is not a redundant TSV, then the method 900 continues since the subsequent TSV was previously connected to an external circuit through its respective I/O switches. At operation 911, inputs and outputs of the subsequent TSV are shifted to those of the next subsequent TSV. Thereafter, the method 900 continues until either a redundant TSV is reached at operation 907 or until the circuit exhausts all available redundant TSVs.

Figure 10:
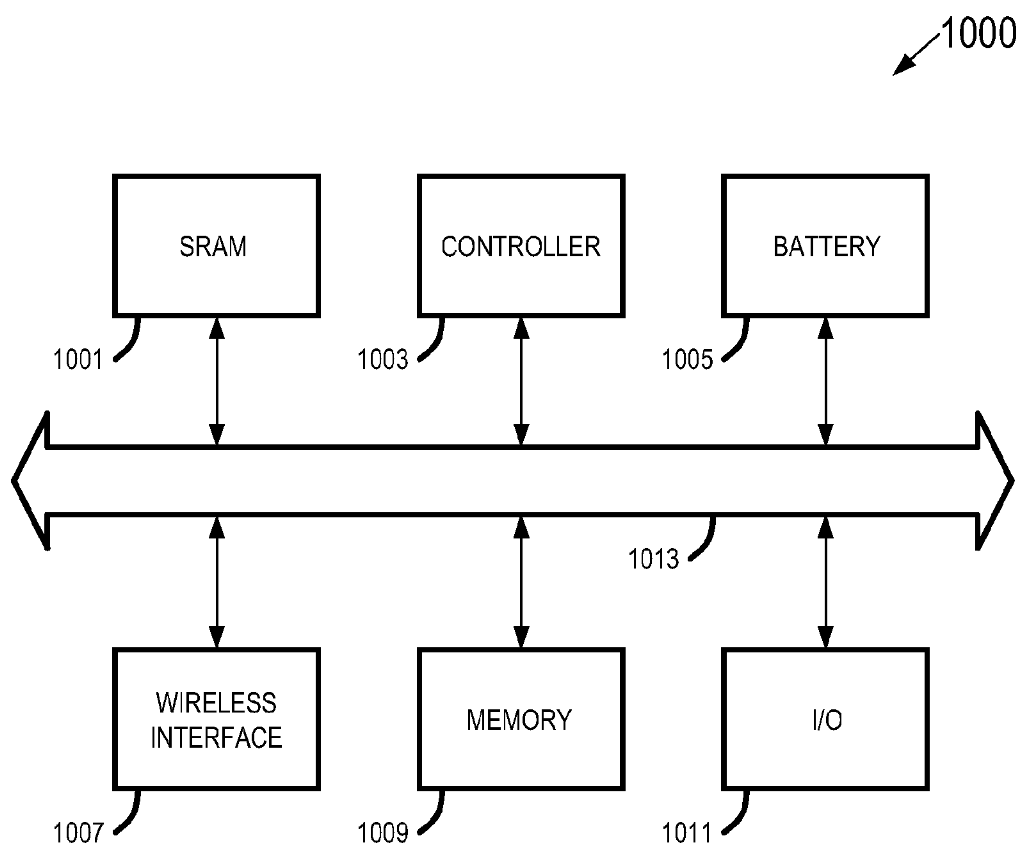
FIG. 10 shows a block diagram of a system embodiment, including a memory device.

With reference now to FIG. 10, a block diagram of an illustrative embodiment of an apparatus in the form of an electronic system 100 including one or more memory devices is shown. The memory device may be comprised of stacked integrated circuit dice, as discussed above. The system 1000 may be used in devices such as, for example, a personal digital assistant (PDA), a laptop or portable computer with or without wireless capability, a web tablet, a wireless telephone, a pager, an instant messaging device, a digital music player, a digital camera, or other devices that may be adapted to transmit or receive information either wirelessly or over a wired connection. The system 1000 may be used in any of the following systems: a wireless local area network (WLAN) system, a wireless personal area network (WPAN) system, or a cellular network.

The system 1000 of FIG. 10 is shown to include a controller 1003, an input/output (I/O) device 1011 (e.g., a keypad, a touchscreen, or a display), a memory device 1009, a wireless interface 1007, and a static random access memory (SRAM) device 1001 coupled to each other via a bus 1013. A battery 1005 may supply power to the system 1000 in one embodiment. The memory device 1009 may include a NAND memory, a flash memory, a NOR memory, a combination of these, or the like.

The controller 1003 may include, for example, one or more microprocessors, digital signal processors, micro-controllers, or the like. The memory device 1009 may be used to store information transmitted to or by the system 1000. The memory device 1009 may optionally also be used to store information in the form of instructions that are executed by the controller 1003 during operation of the system 1000 and may be used to store information in the form of user data either generated, collected, or received by the system 1000 (such as image data). The instructions may be stored as digital information and the user data, as disclosed herein, may be stored in one section of the memory as digital information and in another section as analog information. As another example, a given section at one time may be labeled to store digital information and then later may be reallocated and reconfigured to store analog information. The controller 1003 may include one or more of the novel memory devices described herein.

The I/O device 1011 may be used to generate information. The system 1000 may use the wireless interface 1007 to transmit and receive information to and from a wireless communication network with a radio frequency (RF) signal. Examples of the wireless interface 1007 may include an antenna, or a wireless transceiver, such as a dipole antenna. However, the scope of the inventive subject matter is not limited in this respect. Also, the I/O device 1011 may deliver a signal reflecting what is stored as either a digital output (if digital information was stored), or as an analog output (if analog information was stored). While an example in a wireless application is provided above, embodiments of the inventive subject matter disclosed herein may also be used in non-wireless applications as well. The I/O device 1011 may include one or more of the novel stacked devices described herein. Further, various embodiments described in the figures can be included as part of various ones of the devices on the bus of FIG. 10.

The various illustrations of the methods and apparatuses are intended to provide a general understanding of the structure of various embodiments and are not intended to provide a complete description of all the elements and features of the apparatuses and methods that might make use of the structures, features, and materials described herein.

In various embodiments, an apparatus is provided to test TSVs and includes at least one transceiver to apply a test pattern to a first end of the TSVs. At least one receive transceiver receives the test pattern from a second end of the TSVs and a test register stores the test pattern. A comparator compares the stored test pattern with the applied test pattern to test the TSVs for open-circuit connections.

In at least some of the embodiments, the apparatus also includes at least one redundant through-substrate via. A pull-up device coupled to the first ends of each of the at least one redundant TSV provides a high-data value to the redundant TSVs. A redundant master transceiver and a redundant slave transceiver are also coupled to the first and second ends, respectively, of each of the redundant TSVs. A redundant slave transceiver is coupled to the second end of redundant TSVs and is further coupled to the test register.

In various embodiments, an apparatus is provided that includes a number of TSVs to couple to one or more devices, at least one redundant TSV to allow a repair of the apparatus, and a pair of pull-up devices coupled to the TSVs and the redundant TSV to provide a high-data value to the first end of the respective TSVs. A test register is coupled the second end of each of the TSVs and the redundant TSV to store a received version of the high-data value. A comparator compares the high-data value with the received version of the high-data value to test the TSVs for short-circuit connections.

In some embodiments of the apparatus, at least one master transceiver applies a test pattern to a first end of the TSVs. At least one slave transceiver receives the test pattern from a second end of the TSVs.

In various embodiments, an apparatus is provided that includes a number of TSVs and at least an integral number, n, of redundant TSVs. A switched input and a switched output is coupled to respective inputs and outputs of each of the TSVs and the redundant TSVs. Each of the switched inputs and the switched outputs may have, for example, three switchable inputs and three switchable outputs. The switched inputs and switched outputs are arranged to switch out a defective TSV with a subsequently located TSV.

In various embodiments, a method for testing through-substrate vias is provided that includes applying a test pattern to a first end of the through-substrate vias, receiving the test pattern from a second end of the through-substrate vias, and storing the received test pattern. The applied test pattern is compared with the received test pattern. A determination is made whether the through-substrate vias have an open connection based on a result from the comparison.

In some embodiments of the method, based on a determination that one or more of the TSVs do not have an open connection, a short-connection test is performed that includes applying a high-data value to the first end of the TSVs, receiving a data value from the second end of the TSVs, storing the received-data value, and comparing the received-data value with the high-data value. A determination is made whether the TSVs have a short connection based on a result from the comparison.

In various embodiments, a method is provided for repairing a defective TSV. The method includes indentifying a defective TSV, disabling an input and an output from the defective TSV, and shifting the input and the output from the defective TSV to a respective input and output of a subsequent TSV.

In some embodiments of the method, a determination whether the subsequent TSV is a redundant TSV. In some embodiments, based on a determination that the subsequent TSV is a redundant TSV, the TSV repair is terminated.

In some embodiments of the method, based on a determination that the subsequent TSV is not a redundant TSV, the input and output from the subsequent TSV is shifted to a respective input and output of a next subsequent TSV.

The apparatuses of the various embodiments may include or be included in, for example, electronic circuitry used in high-speed computers, communication and signal processing circuitry, single or multi-processor modules, single or multiple embedded processors, multi-core processors, data switches, and application-specific modules including multilayer, multi-chip modules, or the like. Such apparatuses may further be included as sub-components within a variety of electronic systems, such as televisions, cellular telephones, personal computers (e.g., laptop computers, desktop computers, handheld computers, tablet computers, etc.), workstations, radios, video players, audio players, vehicles, medical devices (e.g., heart monitors, blood pressure monitors, etc.), set top boxes, and various other electronic systems.

A person of ordinary skill in the art will appreciate that, for this and other methods (e.g., programming or read operations) disclosed herein, the activities forming part of various methods may be implemented in a differing order, as well as repeated, executed simultaneously, or substituted one for another. Further, the outlined acts and operations are only provided as examples, and some of the acts and operations may be optional, combined into fewer acts and operations, or expanded into additional acts and operations without detracting from the essence of the disclosed embodiments.

The present disclosure is therefore not to be limited in terms of the particular embodiments described in this application, which are intended as illustrations of various aspects. Many modifications and variations can be made, as will be apparent to a person of ordinary skill in the art upon reading and understanding the disclosure. For example, although each of the embodiments discussed TSVs used to communicate through various dice, the same or similar arrangements may be used to communicate from one side of a die to circuitry formed on the back side of the same die. Functionally equivalent methods and apparatuses within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is to be limited only by the terms of the appended claims, along with the full scope of equivalents to which such claims are entitled. It is also to be understood that the terminology used herein is for the purpose of describing particular embodiments only and is not intended to be limiting.

Moreover, the description provided herein includes illustrative apparatuses (circuitry, devices, structures, systems, and the like) and methods (e.g., processes, protocols, sequences, techniques, and technologies) that embody various aspects of the subject matter. In the following description, for purposes of explanation, numerous specific details are set forth in order to provide an understanding of various embodiments of the subject matter. It will be evident, however, to those skilled in the art that various embodiments of the subject matter may be practiced without these specific details. Further, well-known apparatuses and methods have not been shown in detail so as not to obscure the description of various embodiments. Additionally, as used herein, the term "or" may be construed in an inclusive or exclusive sense.

The Abstract of the Disclosure is provided to comply with 37 C.F.R. §1.72(b), requiring an abstract allowing the reader to quickly ascertain the nature of the technical disclosure. The abstract is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An apparatus to test through-substrate vias, the apparatus comprising:

at least one master transceiver configured to apply a test pattern to a first end of the through-substrate vias;

at least one slave transceiver configured to receive the test pattern from a second end of the through-substrate vias;

pull-up devices coupled to outputs of each of the at least one master transceiver and the at least one slave transceiver, the pull-up devices being configured to apply a data value to the first end of the through-substrate vias;

a test register to couple to at least one receive gate to store the test pattern; and a comparator to compare the stored test pattern with the applied test pattern to test the through-substrate vias for open-circuit connections.

2. The apparatus of claim 1, wherein the test register is further configured to receive a data value from the second end of the through-substrate vias, the comparator to compare the received-data value with the applied-data value.

3. The apparatus of claim 2, wherein the comparator is to make a determination whether to perform a repair of one or more through-substrate vias based on a result of the comparison exceeding a predetermined value.

4. The apparatus of claim 1, wherein the apparatus is configured to operate automatically to use a built-in self test to test the through-substrate vias upon power being applied to the apparatus.

5. The apparatus of claim 1, further comprising:

at least one redundant through-substrate via having a first end and a second end;

at least one additional pull-up device coupled to a first end of each of the at least one redundant through-substrate via to provide a data value to the first end of the at least one redundant through-substrate via ;

a redundant master transceiver coupled to the first end of each of the redundant through-substrate vias; and a redundant slave transceiver coupled to the second end of each of the at least one redundant through-substrate vias, the second end further coupled to the test register.

6. The apparatus of claim 1, further comprising a second slave transceiver having an input coupled in series with the at least one slave transceiver to receive the test pattern and transmit the test pattern in a chain, the input further coupled to the test register.

7. An apparatus to test through-substrate vias, the apparatus comprising:

a number of through-substrate vias to couple to one or more devices, each of the number of through-substrate vias having a first end and a second end;

at least one redundant through-substrate via having a first end and a second end and configured to allow a repair of the apparatus;

a pair of pull-up devices coupled to the first end of each of the number of through-substrate vias and the first end of the at least one redundant through-substrate via to provide a data value to the first end of the respective through-substrate via; and a comparator to compare the data value with the received version of the data value to test the through-substrate vias for short-circuit connections.

8. The apparatus of claim 7, further comprising:

at least one master transceiver configured to apply a test pattern to the first end of the through-substrate vias; and at least one slave transceiver configured to receive the test pattern from the second end of the through-substrate vias.

9. The apparatus of claim 7, further comprising:

a redundant master transceiver coupled to the first end of each of the redundant through-substrate vias; and a redundant slave transceiver coupled to the second end of each of the at least one redundant through-substrate vias, the second end further coupled to the test register.

10. The apparatus of claim 7, further comprising a test register coupled the second end of each of the number of through-substrate vias and the second end of the at least one redundant through-substrate via to store a received version of the data value.

11. A method of testing through-substrate vias, the method comprising:

making a determination whether to perform an open-connection test or a short-connection test;

based on a decision to perform the open-connection test, generating a predetermined test pattern from at least one master transceiver coupled to the through-substrate vias;

applying the predetermined test pattern to a first end of the through-substrate vias;

receiving, by at least one slave transceiver, the test pattern from a second end of the through-substrate vias;

comparing the applied predetermined test pattern with the received test pattern; and making a determination whether the through-substrate vias have an open connection based on a result from the test pattern comparison; and based on a decision to perform the short-connection test, enabling a pull-up device to produce an applied-data value;

applying the applied-data value to the first end of the through-substrate vias;

receiving a data value from the second end of the through-substrate vias;

comparing the received-data value with the applied-data value; and making a determination whether the through-substrate vias have a short connection based on a result from the data value comparison.

12. The method of claim 11, further comprising storing the received test pattern in either the at least one master transceiver or the at least one slave transceiver prior to comparing the applied test pattern with the received test pattern.

13. The method of claim 11, further comprising based on a determination that one or more of the through-substrate vias have an open connection, repairing the one or more through-substrate vias, the repairing being performed by substituting at least one redundant through-substrate via located within a circuit under test for the one or more of the through-substrate vias that have an open connection within the circuit under test.

14. The method of claim 11, further comprising based on a determination to perform the open-connection test, sequentially performing the short-connection test subsequent to making a determination that the through-substrate vias do not have an open connection.

15. The method of claim 14, further comprising:

prior to performing the short-connection test, disabling transceivers used to apply the test pattern to the first end of the through-substrate via;

disabling transceivers used to receive the test pattern; and enabling a pull-up device to produce the applied-data value.

16. The method of claim 14, further comprising based on the determination that one or more of the through-substrate vias have a short connection, repairing the one or more through-substrate vias, the repairing being performed by substituting at least one redundant through-substrate via located within a circuit under test for the one or more of the through-substrate vias that have an short connection within the circuit under test.

17. The method of claim 14, wherein making the determination includes determining whether the received-data value is less than a predetermined percentage of the applied- data value, the predetermination being based on a short tolerance of circuits coupled to each of the through-substrate vias.

18. An apparatus to test through-substrate vias, the apparatus comprising:

at least one master transceiver configured to apply a test pattern to a first end of the through-substrate vias;

at least one slave transceiver configured to receive the test pattern from a second end of the through-substrate vias;

at least one redundant through-substrate via having a first end and a second end;

a pull-up device coupled to a first end of each of the at least one redundant through-substrate via to provide a data value to the first end of the at least one redundant through-substrate via;

a redundant master transceiver coupled to the first end of each of the redundant through-substrate vias;

a redundant slave transceiver coupled to the second end of each of the at least one redundant through-substrate vias, the second end further coupled to the test register;

a test register to couple to at least one receive gate to store the test pattern; and a comparator to compare the stored test pattern with the applied test pattern to test the through-substrate vias for open-circuit connections.

* * * * *